(12) United States Patent
Barnett et al.

(10) Patent No.: US 6,189,848 B1
(45) Date of Patent: Feb. 20, 2001

(54) FASTENER WITH INTEGRAL SPRING CLIP

(75) Inventors: Richard Barnett, Mesquite; Steve Vargo, Midlothian; Eric McDonald, Rowlett; Hongyu Jia, Mesquite; An Nguyen, Richardson, all of TX (US)

(73) Assignee: Lucent Technologies, Inc., Murray Hill, NJ (US)

( * ) Notice: Under 35 U.S.C. 154(b), the term of this patent shall be extended for 0 days.

(21) Appl. No.: 09/352,812

(22) Filed: Jul. 13, 1999

(51) Int. Cl.[7] ................................ A47B 96/06; E04G 5/06
(52) U.S. Cl. ......................... 248/231.81; 248/226.11; 248/227.2; 248/231.41; 248/300
(58) Field of Search ................. 248/231.81, 226.11, 248/227.2, 231.41, 300

(56) References Cited

U.S. PATENT DOCUMENTS

| | | | | |
|---|---|---|---|---|
| 1,939,086 | * | 12/1933 | Shafer, Jr. ............................. | 248/33 |
| 2,809,004 | * | 10/1957 | Kaufman et al. ..................... | 248/300 |
| 3,035,803 | * | 5/1962 | Miller .................................. | 248/313 |
| 3,921,253 | * | 11/1975 | Nelson ............................. | 248/300 X |
| 5,676,486 | * | 10/1997 | Keith ............................... | 248/300 X |
| 6,073,896 | * | 6/2000 | McFadden ....................... | 248/300 X |
| 6,094,347 | * | 7/2000 | Bhatia ................................ | 361/695 |

* cited by examiner

*Primary Examiner*—Leslie A. Braun
*Assistant Examiner*—A. Joseph Wujciak
(74) *Attorney, Agent, or Firm*—Locke Liddell & Sapp LLP

(57) ABSTRACT

A fastener for removably mounting a housing to a shelf includes a base having an upper surface and a lower surface adapted for connection to a bottom panel of the housing at an edge portion of the housing. The base includes a front edge and a portion extending from the front edge which is turned under the base and is disposed spaced apart from the base and adjacent to a lower surface of the base to form a spring clip. The clip engages an edge portion of the shelf between the lower surface of the base and the portion extending from the base front edge.

15 Claims, 5 Drawing Sheets

FASTENER WITH INTEGRAL SPRING CLIP

TECHNICAL FIELD OF THE INVENTION

The present invention relates to fasteners, and more particularly to a fastener with an integral spring clip for use in reducing electromagnetic interference emissions.

BACKGROUND OF THE INVENTION

Electronic equipment, particularly in the field of telecommunications, is generally housed within a chassis which is positioned on a shelf within a rack. The equipment, such as, for example, rectifiers may generate undesirable electromagnetic interference (EMI) emissions which can be reduced by utilizing a gasket strip attached to the chassis to ensure good metal to metal contact between the chassis and the shelf. The strip is compressed by the weight of the chassis when inserted onto the shelf. In the case of a shelf not having a top, it is not possible to sufficiently press the gasket under the weight of the chassis, resulting in insufficient contact between the chassis and shelf to provide insufficient EMI emission reduction. Further, in the case of a topless shelf, there is insufficient vertical restraint on the chassis, such that the chassis is not properly mounted to the shelf.

A need thus exists for a fastener for providing sufficient EMI contact pressure and vertical restraint between a chassis and a shelf of an electronic equipment rack to prevent vertical movement of the chassis on the shelf. Additionally, a need has arisen for a fastener for mounting a panel to the chassis wherein the panel may include, such as for example, a fan.

SUMMARY OF THE INVENTION

In accordance with the present invention, a fastener for removably attaching a housing to a shelf having an edge portion, wherein the housing includes a bottom panel having an edge portion is provided. The fastener includes a base having an upper surface and a lower surface adapted for connection to the bottom panel of the housing at the edge portion of the housing. The base includes a front edge and a rear edge. The base further includes a portion extending from the base front edge and turned under the base and being spaced apart from and disposed adjacent to the lower surface of the base to form a spring clip for engaging the shelf edge portion between the base lower surface and the portion extending from the base front edge.

In accordance with another aspect of the present invention, in a conductive shelf and housing combination wherein the housing is supported by the shelf with a fastener removably attached to a portion of the housing and mountable with the housing on a portion of the shelf in electrical contact with the housing and the shelf, the housing having an edge portion formed from a bottom panel and the housing having a space above the bottom panel for mounting electrical components therein, an improved fastener is provided. The fastener includes a conductive elongated base having an upper surface adapted for connection in support of the bottom panel mounted at the edge portion of the housing. The elongated base includes a lower surface which faces away from the bottom panel. A portion of the elongated base extends away from the edge portion of the housing and is turned under the base to face the lower surface of the base and form a clip which removable positions the housing in electrical contact with the shelf.

In accordance with another aspect of the present invention, a system for reducing electromagnetic interference emissions is provided. The system includes a housing having a bottom panel having an edge portion. An electrically conductive shelf is provided for supporting the housing. An electrically conductive fastener selectively attaches the housing to the shelf along the edge portion of the shelf. The fastener includes a base having an upper surface, a lower surface, a front edge portion and a rear edge portion. The upper surface of the base is disposed adjacent to the bottom panel, and the lower surface of the base is disposed adjacent to the shelf. The front edge portion of the base is disposed adjacent to the housing edge portion. The base includes a portion extending from the front edge portion and is turned under the base and is spaced apart from and disposed adjacent to the lower surface to form a clip for engaging the shelf edge portion between the base lower surface and the portion extending from the base front edge to thereby mount the housing to the shelf and such that the fastener provides electromagnetic interference emission coupling between the housing and the shelf.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
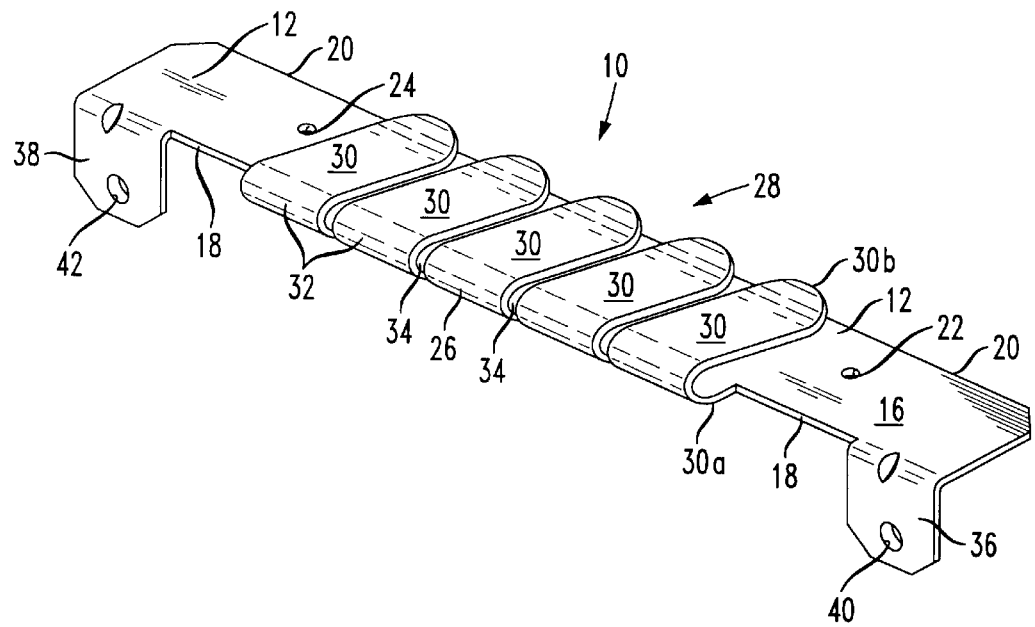
FIG. 1 is a bottom perspective view of the present fastener.
Figure 2:
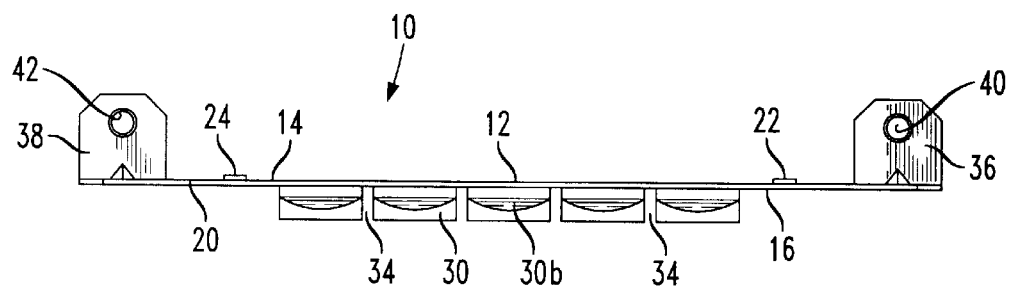
FIG. 2 is a rear elevational view of the fastener shown in FIG. 1.
Figure 3:
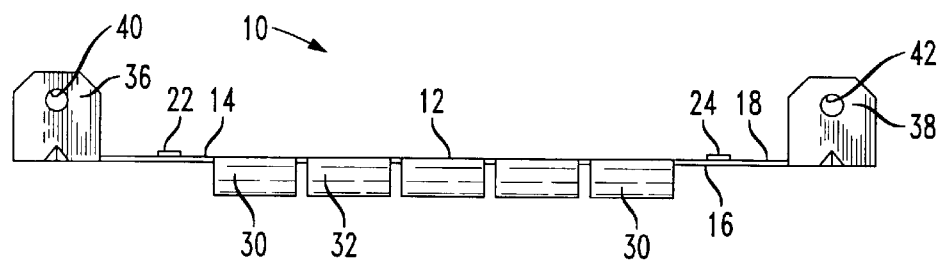
FIG. 3 is a front elevational view of the fastener shown in FIG. 1.
Figure 4:
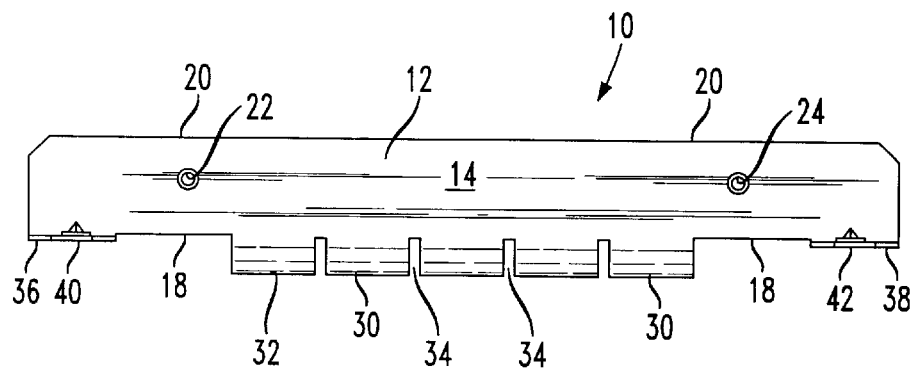
FIG. 4 is a top plan view of the fastener shown in FIG. 1.
Figure 5:
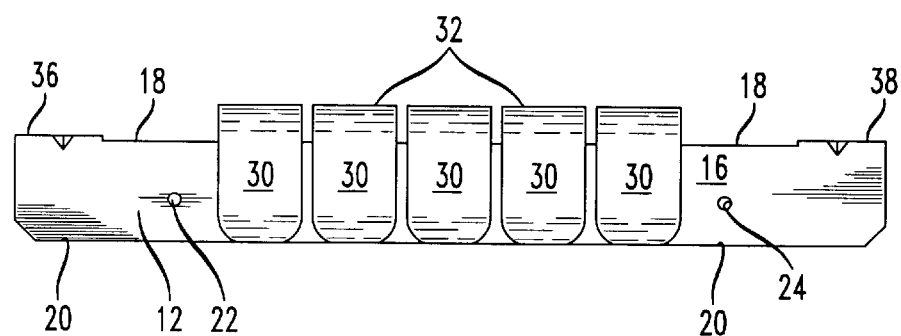
FIG. 5 is a bottom plan view of the fastener shown in FIG. 1.

Referring simultaneously to FIGS. 1–6, the present fastener is illustrated, and is generally identified by the numeral 10. Fastener 10 may be fabricated from heat treated carbon spring steel, and includes a base 12. Base 12 includes an upper surface 14 and a lower surface 16. Base 12 further includes a front edge 18 and a rear edge 20.

Extending from front edge 18 of base 12 is an extension portion 26 which is turned under base 12 and is spaced apart from and disposed adjacent to lower surface 16 of base 12 to form a clip generally identified by the numeral 28. Clip 28 engages a shelf, to be further described with respect to FIG. 8. Extension portion 26 includes a plurality of fingers 30 each having ends 30a and 30b. Fingers 30 include an arcuate portion 32 which extends a distance beyond front edge 18 of base 12. Fingers 30 are spaced apart from each other by a gap 34. While five fingers 30 are illustrated in the figures, it is understood that the present fastener 10 can be utilized with additional fingers 30 or fewer fingers 30, five fingers being shown for illustrative purposes only.

Figure 6:
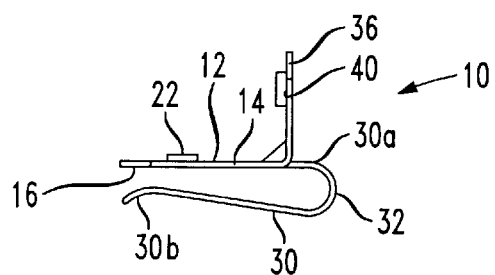
FIG. 6 is a left end view of the fastener shown in FIG. 1.

As more clearly illustrated in FIG. 6, the distance between end 30b of fingers 30 and lower surface 16 of base 12 is less than the thickness of the shelf to which fastener 10 is attached. Extension portion 26 of base 12 forms a spring which is spread apart by the introduction of the shelf between fingers 30 and base 12 such that fastener 10 positively engages the shelf by squeezing the shelf to which it is attached.

Extending from front edge 18 of base 12 are tabs 36 and 38. Tabs 36 and 38 are perpendicularly disposed to upper surface 14 of base 12 and includes apertures 40 and 42, respectively. Tabs 36 and 38 are utilized for mounting an end panel to a housing which is affixed to the shelf as will subsequently be described with respect to FIG. 7.

Figure 7:
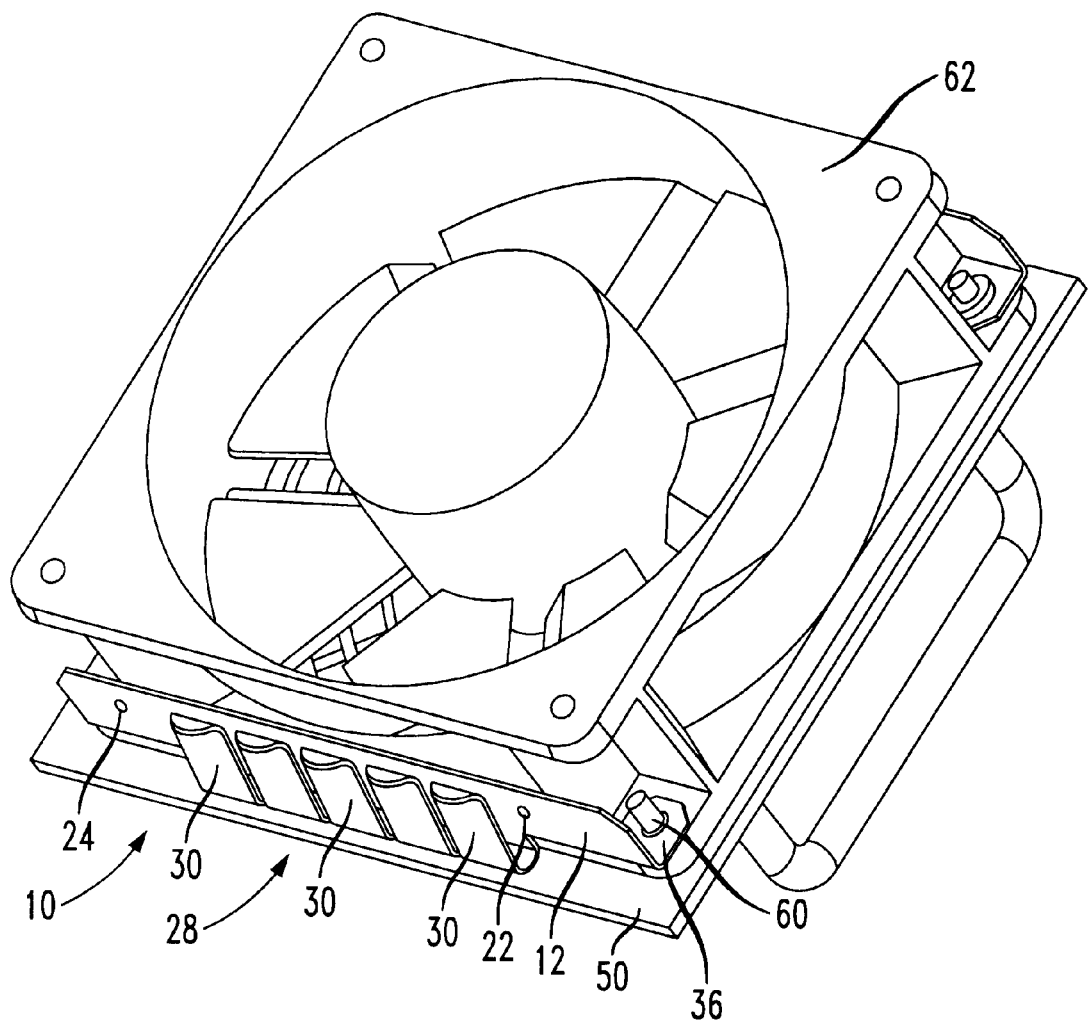
FIG. 7 is a perspective view of the fastener shown in FIG. 1 connected to an end panel including a fan.
Figure 8:
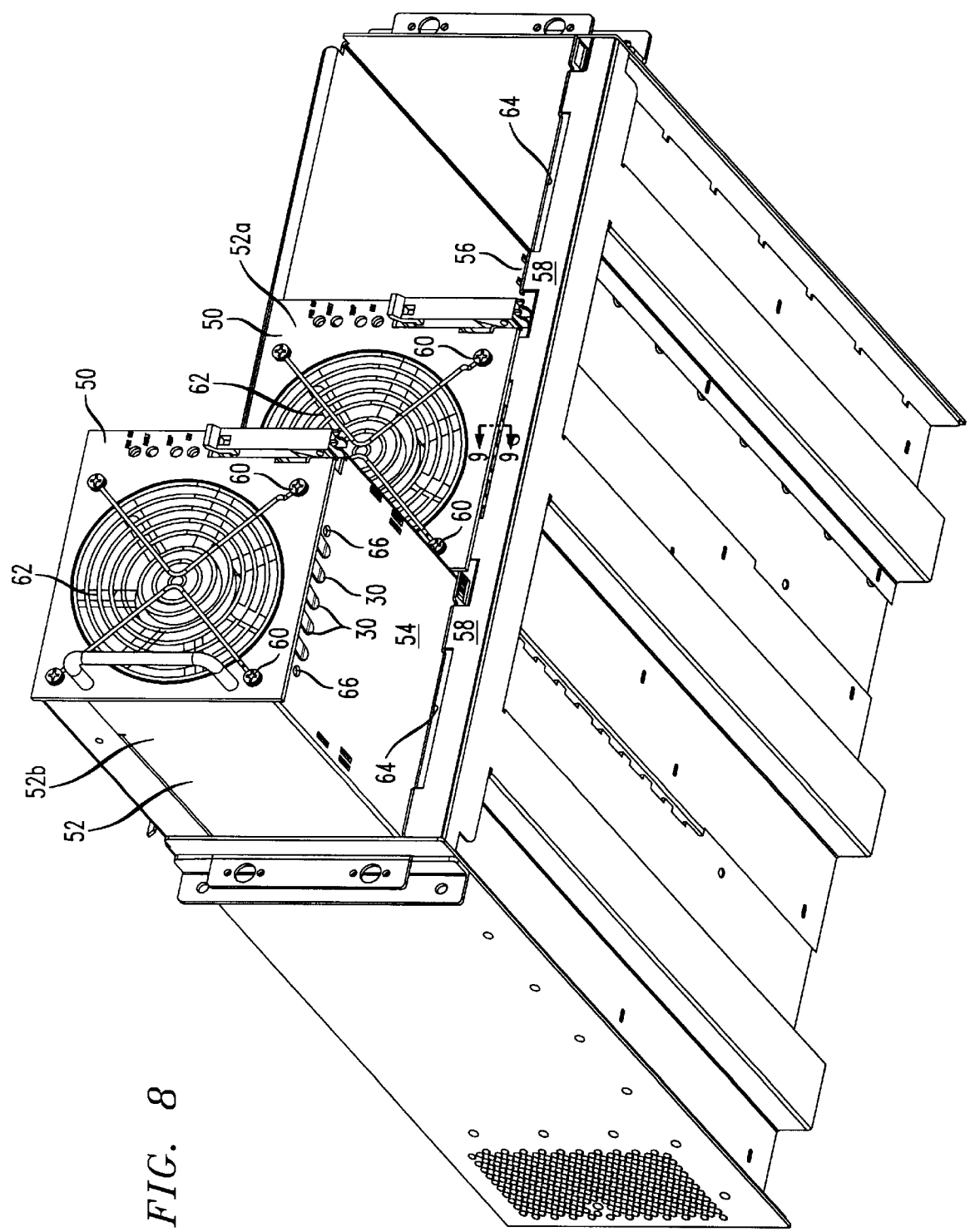
FIG. 8 is a perspective view of the present fastener attached to a chassis which is mounted to a shelf.
Figure 9:
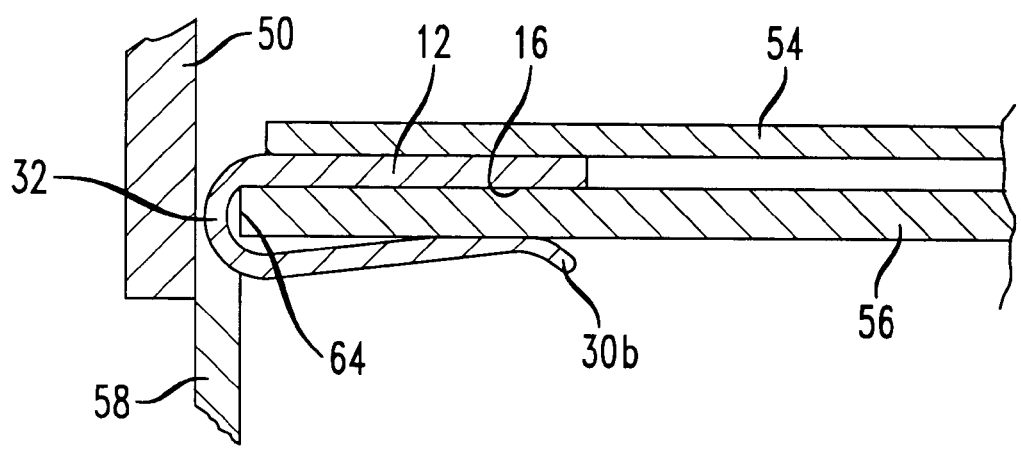
FIG. 9 is an enlarged sectional view taken generally along sectional lines 9—9 of FIG. 8.

Referring simultaneously to FIGS. 7, 8, and 9, fastener 10 interconnects an end panel 50 to a housing 52. Housing 52 includes a bottom panel 54. Fastener 10 is interconnected to bottom panel 54 of housing 52 and through the use of clip 28, housing 52 is attached to a shelf 56 having a panel 58.

As best illustrated in FIG. 7, fastener 10 is connected to end panel 50 through tabs 36 and 38 using a fastener, such as for example, a screw 60, interconnected through apertures 40 and 42. End panel 50 includes a fan 62 for cooling housing 52.

Fastener 10 is interconnected via apertures 22 and 24 (FIG. 7) in base 12 to bottom panel 54 of housing 52 using screws 66 or the like. Housing 52 is in turn mounted to an edge portion 64 of shelf 56 by the insertion of edge portion 64 between fingers 30 and lower surface 16 of base 12. FIG. 8 illustrates a housing 52a connected to shelf 56, and a housing 52b ready to be connected to shelf 56, but not yet mounted to edge 64 of shelf 56. The thickness of shelf 56 is greater than the distance between ends 30b and lower surface 16 of base 12, such that fingers 30 are extended and squeeze edge portion 64 of shelf 56 when fastener 10 is inserted on shelf 56. In this manner, fastener 10 mounts housing 52 to shelf 56 and provides a ground contact between housing 52 and shelf 56. Housing 52 may include electronic components, such as for example, a rectified which generates electromagnetic interference emissions. Such emissions are effectively coupled through fastener 10 to shelf 56 to thereby reduce such emissions, where fastener 10, bottom panel 54, and shelf 56 are all electrically conductive. Fastener 10 provides a vertical restraint to housing 52 when mounted to shelf 56.

It therefore can be seen that the present fastener combines the function of an electromagnetic interference strip, mechanical clamp for attaching a housing to a rack shelf, and a fan mounting bracket into a single unit. The present fastener solves the problem of obtaining good electromagnetic interference contact between a rectifier chassis and shelf of a rack while providing mechanical latching to prevent vertical movement of a chassis on a shelf of a rack.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. In a conductive shelf and housing combination wherein the housing is supported by the shelf with a fastener removably attached to a portion of the housing and mountable with the housing on a portion of the shelf in electrical contact with the housing and the shelf, the shelf having a thickness, the housing having an edge portion formed from a bottom panel, and the housing having a space above the bottom panel for mounting electrical components, an improved fastener comprising:

a conductive elongated base having an upper surface adapted for connection in support of the bottom panel mounted at the edge portion of the housing;

said elongated base having a lower surface which faces away from the bottom panel; and a portion of said elongated base extending away from the edge portion of the housing, said portion being turned under said base to face said lower surface of said base and form a clip which removably positions the housing in electrical contact with the shelf.

2. The fastener of claim 1 wherein said portion of said base includes a plurality of spaced apart fingers.

3. The fastener of claim 1 wherein said portion of said base is spaced apart from said lower surface of said base by a distance less than the thickness of the shelf.

4. The fastener of claim 1 wherein said base includes a tab disposed generally perpendicular to said base upper surface.

5. The fastener of claim 1 wherein said base includes a tab disposed adjacent the edge portion of the housing and generally perpendicular to said base upper surface.

6. A system for reducing electromagnetic interference emissions comprising:

an electrically conductive housing having a bottom panel and an end panel, said bottom panel having an edge portion;

an electrically conductive shelf for supporting said housing, said shelf having a thickness and an edge portion;

an electrically conductive fastener for selectively attaching said housing to said shelf along said edge portion of said shelf;

said fastener including a base having an upper surface and a lower surface, said base further including a front and rear edge portion, said upper surface of said base disposed adjacent said bottom panel and said lower surface of said base disposed adjacent said shelf, said front edge portion of said base disposed adjacent said housing bottom panel edge portion, said base being adapted to be attached to said bottom panel of said housing; and said base including a portion extending from said front edge portion and turned under said base and being spaced apart from and disposed adjacent said lower surface of said base to form a clip for engaging said shelf edge portion between said base lower surface and said portion extending from said base front edge portion to thereby mount said housing to said shelf, and such that said fastener provides electromagnetic interference emission coupling between said housing and said shelf.

7. The system of claim 6 wherein said portion extending from said based front edge portion of includes a plurality of spaced apart fingers.

8. The system of claim 6 wherein said portion extending from said base front edge portion extends a distance beyond said base front edge portion.

9. The system of claim 6 wherein said portion extending from said base front edge portion is spaced apart from said lower surface of said base by a distance less than said thickness of said shelf.

10. The system of claim 6 wherein said base includes a tab disposed generally perpendicular to said base upper surface for mounting said end panel to said housing.

11. The system of claim 6 wherein said base includes a tab disposed adjacent said edge portion of said housing bottom panel and disposed generally perpendicular to said base upper surface for mounting said housing end panel to said housing.

12. The system of claim 6 wherein said base includes a pair of spaced apart tabs disposed generally perpendicular to said base upper surface for mounting said end panel to said housing.

13. The system of claim 12 wherein said portion extending from said front edge portion of said base is disposed between said pair of tabs.

14. The system of claim 13 wherein said end panel includes a fan for cooling said housing.

15. The system of claim 14 wherein said portion extending from said front edge portion of said base includes a plurality of spaced apart fingers.

* * * * *